United States Patent
Lin et al.

[11] Patent Number: 6,137,832
[45] Date of Patent: Oct. 24, 2000

[54] ADAPTIVE EQUALIZER

[75] Inventors: Jung-Chen Lin; Menping Chang, both of Cupertino, Calif.

[73] Assignee: Kendin Semiconductor, Inc., Sunnyvale, Calif.

[21] Appl. No.: 09/122,259

[22] Filed: Jul. 24, 1998

[51] Int. Cl.$^7$ .................................................. H03H 7/30
[52] U.S. Cl. ............................................ 375/232; 375/376
[58] Field of Search ................................. 375/373, 376, 375/229, 232, 257; 329/325; 455/260

[56] References Cited

U.S. PATENT DOCUMENTS

| | | | |
|---|---|---|---|
| 4,459,698 | 7/1984 | Yumoto et al. | 375/121 |
| 4,633,200 | 12/1986 | Adler | 333/28 R |
| 4,953,186 | 8/1990 | Levy et al. | 375/371 |
| 5,278,867 | 1/1994 | Sehier et al. | 375/232 |
| 5,341,106 | 8/1994 | Pettigrew | 329/319 |
| 5,602,871 | 2/1997 | Scholz | 375/233 |
| 5,635,786 | 6/1997 | Gerrits et al. | 331/45 |
| 5,731,737 | 3/1998 | Cranford, Jr. et al. | 327/553 |
| 5,825,179 | 10/1998 | Sherman et al. | 324/210 |

Primary Examiner—Stephen Chin
Assistant Examiner—Lenny Jiang
Attorney, Agent, or Firm—Wilson, Sonsini, Goodrich & Rosati

[57] ABSTRACT

Systems and methods are described for adaptive equalizers. A circuit adapted to transform an equalizer input signal at a receiver to approximate an output signal at a transmitter includes an equalizer, a phase matching loop coupled to the equalizer, and an amplitude locking loop coupled to the equalizer. The equalizer can include a number of coarse band segments to provide coarse adjustment, at least one of which includes a number of fine band segments to provide fine adjustment. The systems and methods provide advantages in that multiple cable lengths can be serviced by a single equalizer, variations in the low frequency gain and the location of the zero point due to variations in manufacture and operating temperature are obviated, and a suitable gain can be provided at much higher frequencies.

29 Claims, 11 Drawing Sheets

ADAPTIVE EQUALIZER

BACKGROUND OF THE INVENTION

1. Field of the Invention

The invention relates generally to the field of communications. More particularly, the invention relates to overcoming phase shifts and amplitude attenuations incurred when a signal is sent from a transmitter to a receiver.

2. Discussion of the Related Art

As a signal propagates, the strength of the signal is attenuated. FIG. 1 depicts this attenuation (dB) as a function of frequency (MHz) for a series of ten UTP-5 cable lengths ranging from 10 meters to 100 meters. It can be appreciated from the family of curves depicted in FIG. 1 that the attenuation of the signal increases with increasing frequency, as well as increasing length of propagation.

In addition to attenuated amplitude, as the signal passes through the conductor, a phase shift will be incurred. This phase shift (delay) can be represented in terms of an excessive phase value of negative magnitude. FIG. 2 depicts this excessive phase (degrees) as a function of frequency (MHz) for the same series of ten UTP-5 cable lengths from 10 meters to 100 meters. It can be appreciated from the family of curves depicted in FIG. 2 that the magnitude of the phase shift imposed upon the signal increases with increasing frequency, as well as increasing cable length.

The practical implications of these attenuation and phase shift phenomenon will be made clearer in FIGS. 3–5. The data depicted in FIGS. 3–5 takes the form of time domain representations of amplitude for two signals of different frequency (i.e., a high frequency signal superimposed on a low frequency signal).

FIG. 3 depicts MLT3 data for a one meter long CAT5 cable. It can be appreciated from the time domain data shown in FIG. 3 that the amplitude of the high and low frequency signals has not be significantly attenuated by the one meter long CAT5 cable. The maximum amplitude trace for both the high and low frequency signals is substantially the same. Further, it can be appreciated that the high and low frequency signals have not undergone a substantial phase shift.

FIG. 4 depicts MLT3 data for a 40 meter long CAT5 cable. The maximum amplitude is lower in FIG. 4 compared to FIG. 3 due to the increased length of the cable in the case of FIG. 4. It can be appreciated from the time domain data presented in FIG. 4 that the maximum amplitude of the high frequency signal has decreased to a greater degree compared to the maximum amplitude of the low frequency signal. Further, it can be appreciated that the high frequency signal has been phase shifted more than the low frequency signal.

FIG. 5 depicts MLT3 data for a 110 meter length CAT5 cable. It can be appreciated from the time domain data presented in FIG. 5 that even the low frequency signal has undergone substantial attenuation and phase shift.

It has been known to use an equalizer to compensate for the amplitude attenuation and phase shifting phenomenon. A previously known circuit to implement an equalizer is shown in FIG. 6.

Referring to FIG. 6, the circuit includes a resistor 610 bridging a node M1 and a node M2. The resistor 610 has a value of 2R. The circuit also includes a capacitor 620 bridging a node A and a node B. The capacitor 620 has a value of ½ C. The circuit includes an input transistor 630 and an input transistor 640. Together, these components define an equalizer cell 650. This circuit has been implemented in discrete and bipolar technologies. The basic purpose of this circuit is to provide a high pass filter response to the desired signal.

Still referring to FIG. 6, selecting the frequency threshold of the high pass filter response can be termed providing a zero. The frequency of the zero is determined by the reciprocal of the product of R and C (1/RC). The input voltage can be represented as $$v_{in} = v_i^+ - v_i^-$$

where $v_i^+$, $v_i^-$ are the input signals (differential). The output voltage can be represented as $$v_{out} = v_o^+ - v_o^-.$$

where $v_o^+$, $v_o^-$ are the output signals (differential). $I_0$ is the bias current for the equalizer cell, $g_m$ is the transconductance of the input transistors, and $i_o^+$, $i^-$ are the output currents (differential).

The general transfer function for the circuit shown in FIG. 6 is given by $$A(s) = \frac{v_{out}(S)}{v_{in}(S)} = g_m R_o \frac{\left(S + \frac{1}{RC}\right)}{\left(S + \frac{g_m}{C}\right)} = \frac{R_o}{R}\left[\frac{1 + SRC}{1 + \frac{SC}{g_m}}\right]$$

where S represents frequency. In this equation, the additional pole is introduced at $$\omega_p = \frac{g_m}{C}$$

for bipolar technology. Since $g_m$ is relatively large, the pole can be moved to a much higher frequency than that of the zero. The Bode plot (log—log) of this general transfer function is shown in FIG. 7.

There are significant problems associated with the circuit shown in FIG. 6 when implemented with integrated circuit technology. Four problematic areas are discussed immediately below.

First, a single value of RC can not cover all cable attenuations and phase distortions. In a local area network (LAN), an equalizer needs to compensate for attenuation losses in different cable lengths. While the upper limit of cable length for a LAN is somewhat arbitrary, an upper limit of approximately 100 meters is typical. In such a network there can be a wide variety of cable lengths of from 0 to 100 meters. Further, while different categories of cable are expected to exhibit different characteristics, cables of the same category that are produced by different manufacturers can exhibit different characteristics.

Second, the low frequency gain, $R_0/R$, varies due to the process of manufacture. Specifically, the values of $R_0$ and R can vary 5%, even 10%, due variations in materials and/or processing. Further, the low frequency gain also varies with the temperature of operation. As the circuit warms up, the values of $R_0$ and R will change as a function of temperature.

Third, the location of the high pass response threshold (the zero), 1/RC, varies due to the process of manufacture and the temperature of operation. Further, the accuracy of the individual components can be affected by parasitic components at nodes A and B. Furthermore, the body effect of transistors $M_1$ and $M_2$ will cause the transfer function of the equalizer to deviate from the ideal characteristics.

Fourth, for high frequency operation, $g_m/C$ can be very close to the frequency where the signal is transmitting. This limits the maximum frequency of operation of the equalizer cell 650, which is nevertheless required to provide a gain at high frequencies. This is especially problematic for 100BT or 1000BT operations. In addition, most of the high-level integration data communication circuits are using CMOS technology. The transconductance of CMOS transistors is much lower than that of the bipolar counterpart. This creates a significant problem because the unwanted pole ($g_m/C$) will be even closer to the zero frequency when the transconductance is low.

SUMMARY OF THE INVENTION

A primary goal of the invention is to provide devices adapted to transform an input signal at a receiver to approximate an output signal at a transmitter. Another primary goal of the invention is to provide techniques for transforming the input signal at the receiver to approximate the output signal at the transmitter.

A first aspect of the invention is implemented in embodiments that are based on an equalizer; and a phase matching loop coupled to the equalizer. A second aspect of the invention is implemented in embodiments that are based on an equalizer; and an amplitude locking loop coupled to the equalizer. A third aspect of the invention is implemented in embodiments that are based on an equalizer that includes a plurality of coarse band segments adapted to provide coarse adjustment, at least one of the plurality of coarse band segments including a plurality of fine band segments adapted to provide fine adjustment.

These, and other, goals and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters (if they occur in more than one view) designate the same parts. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the invention in detail.

The context of the invention is the reception of signals that have undergone phase shifts and/or amplitude attenuation. The invention can be implemented with hardwired or wireless communications. In the case of hardwired environments, the invention can be implemented in a communications link with coaxial, parallel, or ordinary twisted pair conductors. The invention can also utilize data processing methods that transform the received signals so as to actuate interconnected discrete hardware elements, such as, for example, subcomponents of the adaptive equalizer (e.g., coarse and fine adjustment segments) or other components (e.g., matrix switches).

Overview

Figure 1:
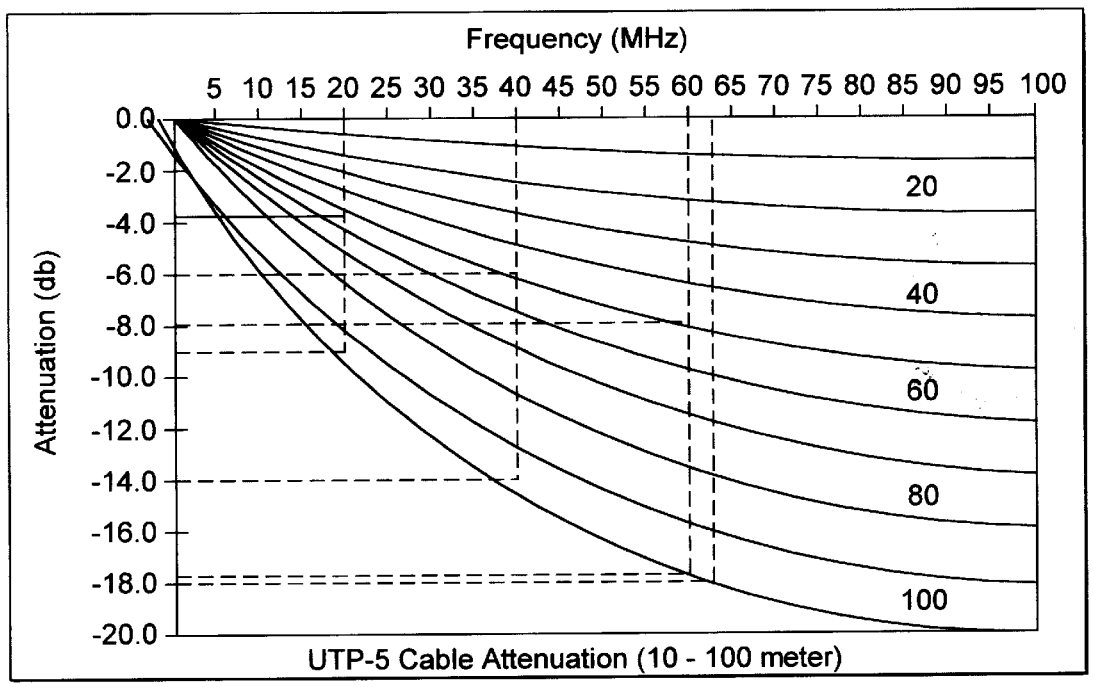
FIG. 1 illustrates attenuation as a function of frequency for ten UTP-5 cable lengths of from 10 to 100 meters, appropriately labeled "prior art."
Figure 2:
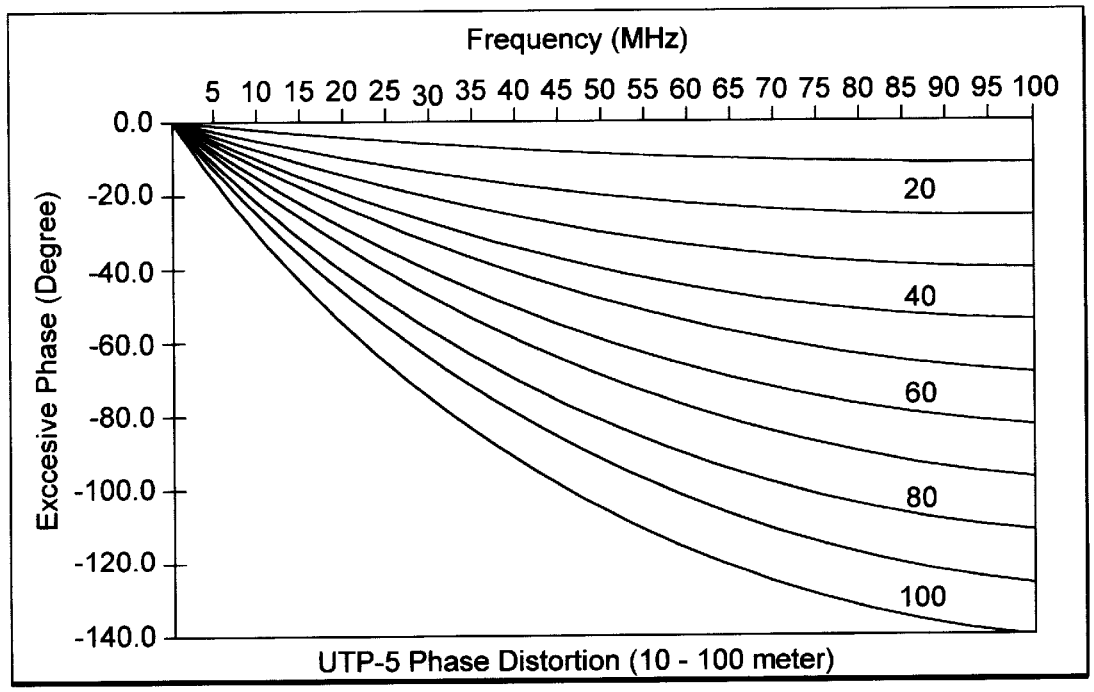
FIG. 2 illustrates excessive phase as a function of frequency for ten UTP-5 cable lengths of from 1 to 100 meters, appropriately labeled "prior art."
Figure 3:
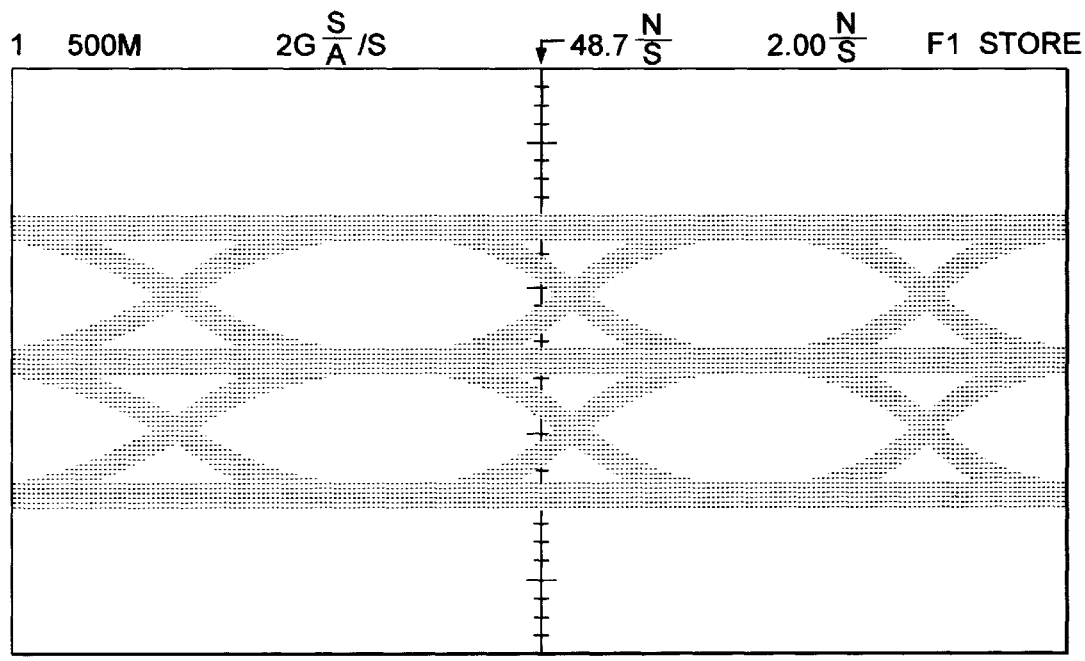
FIG. 3 illustrates a time domain representation of a high frequency signal and a low frequency signal after traveling one meter through a CAT5 cable, appropriately labeled "prior art."
Figure 4:
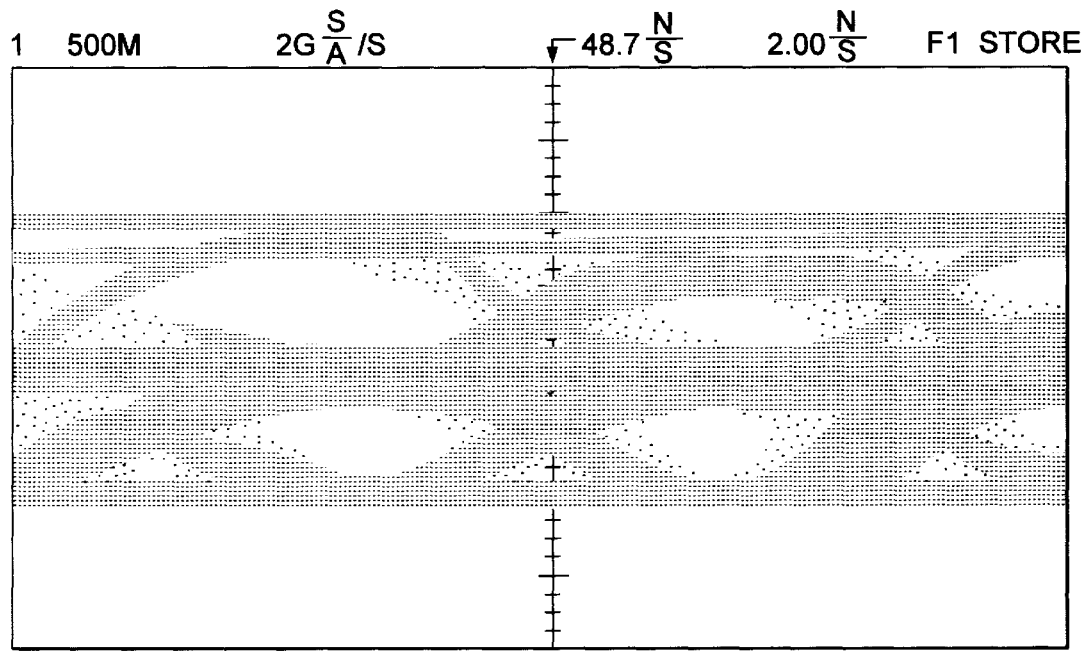
FIG. 4 illustrates a time domain representation of the high frequency signal and the low frequency signal after traveling 40 meters through a CAT5 cable, appropriately labeled "prior art."
Figure 5:
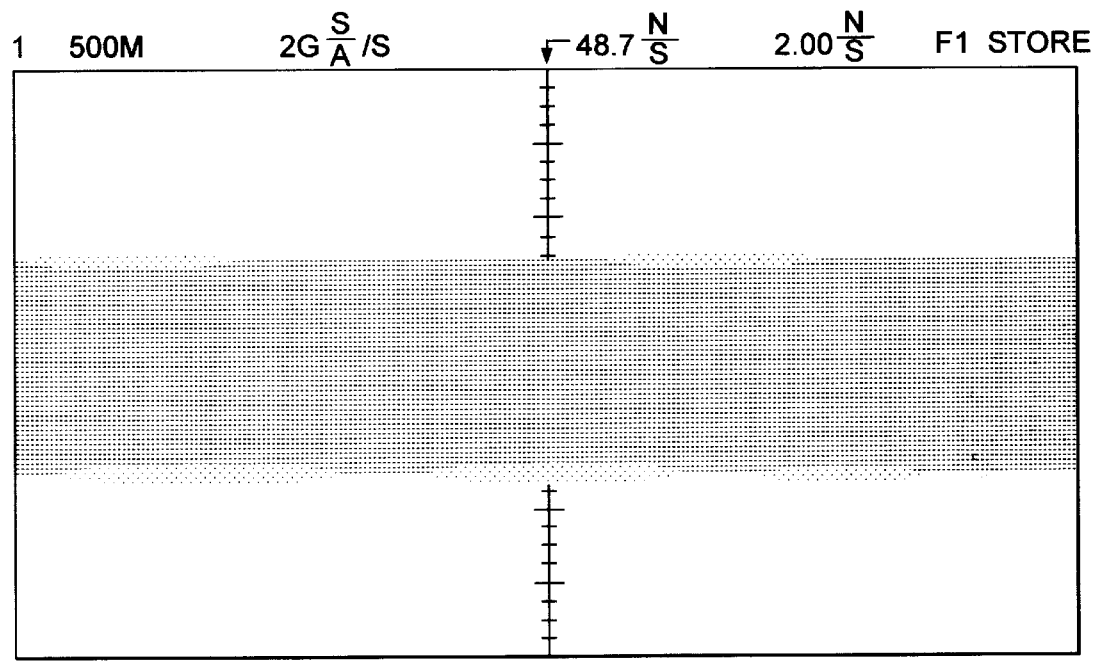
FIG. 5 illustrates a time domain representation of the high frequency signal and the low frequency signal after traveling 110 meters through a CAT5 cable, appropriately labeled "prior art."
Figure 6:
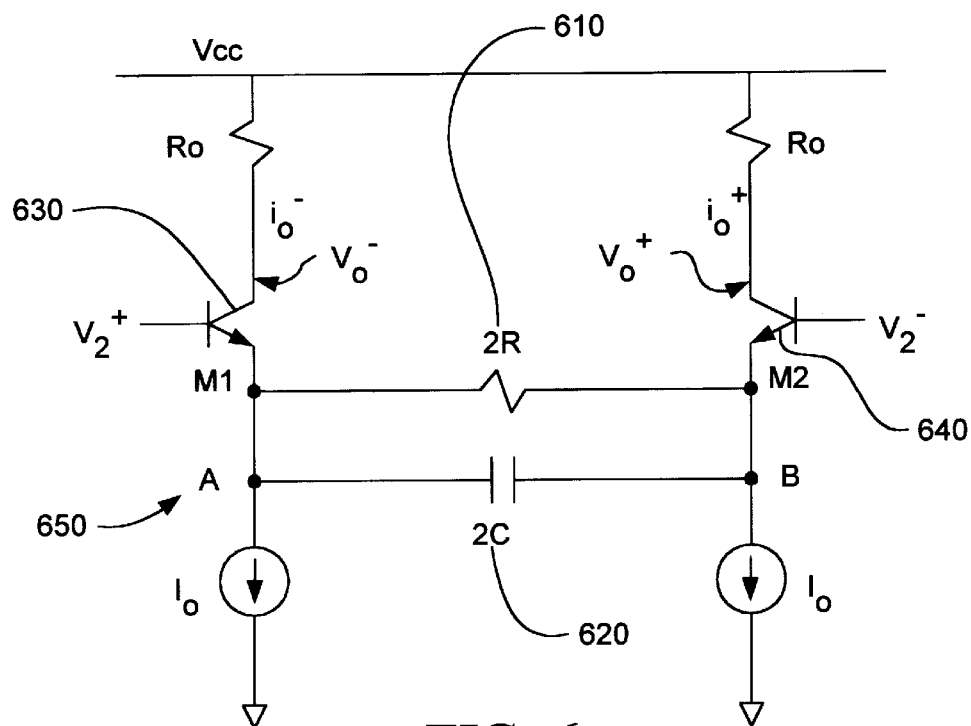
FIG. 6 illustrates an electrical schematic of a known equalizer circuit, appropriately labeled "prior art."
Figure 7:
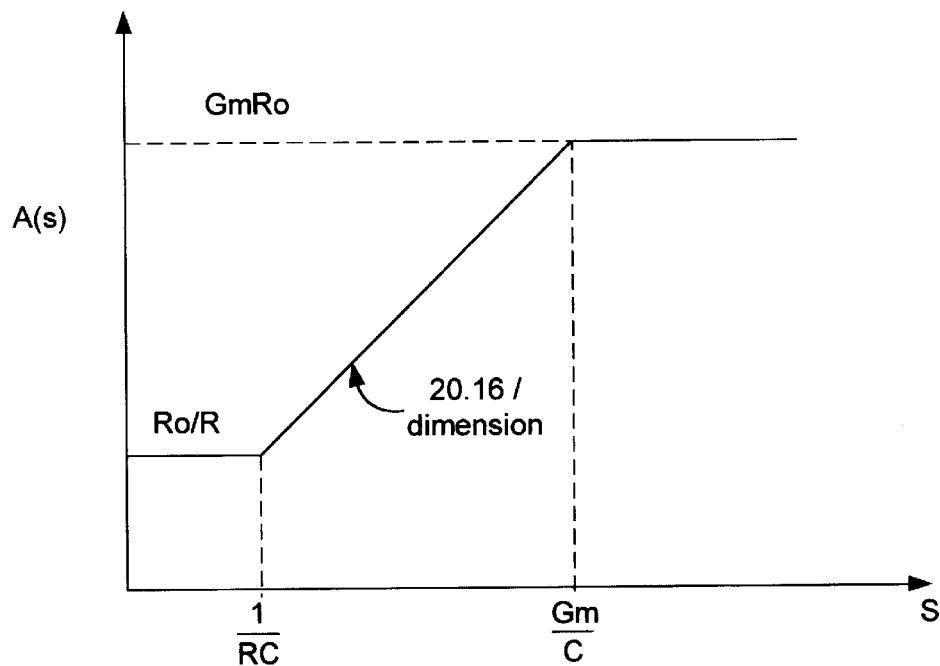
FIG. 7 illustrates a Bode plot of the general transfer function provided by the equalizer circuit shown in FIG. 6, appropriately labeled "prior art."
Figure 8:
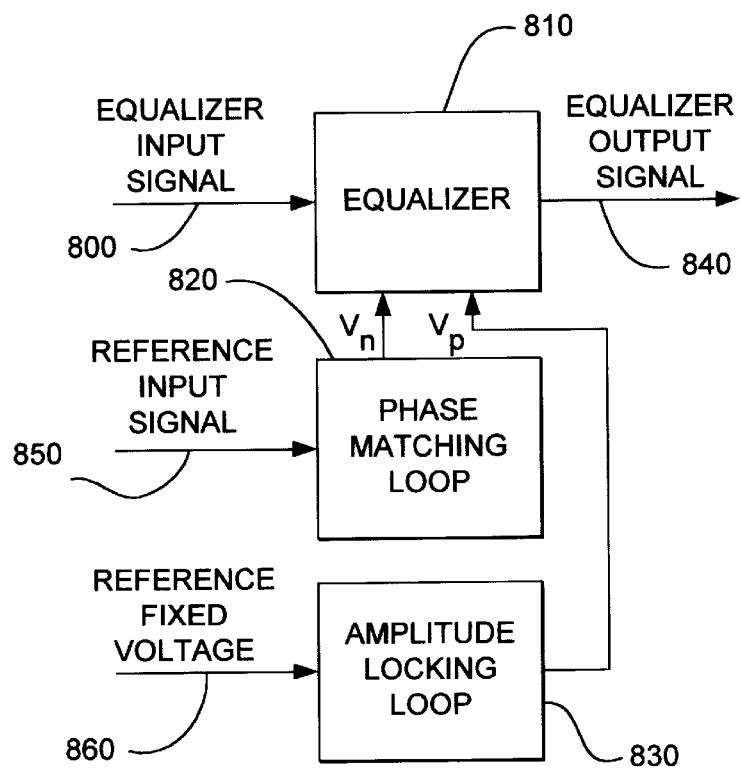
FIG. 8 illustrates a block schematic view of an adaptive equalizer, representing an embodiment of the invention.

Referring to FIG. 8, a schematic block diagram of an adaptive equalizer is depicted. The adaptive equalizer transforms an equalizer input signal 800 (at a receiver that is associated with the adaptive equalizer) into an equalizer output signal 840 so as to approximate a output signal at a transmitter (not shown). An equalizer 810 is coupled to a phase matching loop 820. The term coupled is defined herein as connected, although not necessarily directly, and not necessarily mechanically. The equalizer 810 is also coupled to an amplitude locking loop 830.

Still referring to FIG. 8, a reference input signal 850 is applied to the phase matching loop 820 at a first given frequency and a given amplitude so as to emulate a phase shifted input signal for said first given frequency and a given category of cable having a given cable length. The phase matching loop 820 provides a signal to the equalizer 810 that adapts the phase shifting transformation characteristics of the equalizer 810 for the given category of cable and the given length of cable.

In more detail, a resistance within the phase matching loop 820 is varied so that the phase matching loop 820 will transform a reference input phase of the reference input signal 850 to a reference output phase (corrected phase) that is a function of the first given frequency, the given category of cable, and the given length. The value of the resistance is communicated to the equalizer 810 using the signal. The resistance is employed in the equalizer 810 to transform an input phase of the equalizer input signal 800 so as to approximate an output phase of the output signal at the transmitter (not shown).

Still referring to FIG. 8, a reference fixed voltage 860 is applied to the amplitude locking loop 830 so as to emulate an attenuated input signal at a second given frequency for the given category of cable and the given length. The amplitude locking loop 830 provides a signal $v_p$ to the equalizer 810 that adapts the amplitude transformation characteristics of the equalizer 810 for the given category of cable and the given length of cable.

In more detail, a control voltage within the amplitude locking loop 830 is varied to adjust an output resistance within the amplitude locking loop 830 to optimize a difference between the reference fixed voltage 860 and an output voltage from the amplitude locking loop 830. In the case where the second given frequency corresponds to the high pass response threshold, optimization of the difference is minimizing the difference (no gain at the threshold). The control voltage can be varied by a control differential amplifier within the amplitude locking loop 830 and the control differential amplifier can be controlled by the difference. The value of the control voltage is communicated to the equalizer 810 using the signal $V_p$. The control voltage is employed in the equalizer 810 to transform an input amplitude of the equalizer input signal 800 to approximate an output amplitude of said output signal at the transmitter.

Variation in ($R_0$/R) and (1/RC) in the conventional approach will cause the gain and the location of the zero to deviate from the ideal characteristics. To solve those problems, an internal on-chip timing (or phase) locking circuit can be employed. A replica of the main equalizer can be used as a base for a phase locking circuit. The output of a second replica of the equalizer that does not have capacitors can be compared against the output of the first replica. This first replica can have capacitors. This phase locking circuit can be designed to provide fixed phase and amplitude responses for given signal at given frequency which can be exact the opposite of the cable characteristics.

First Aspect

Figure 9:
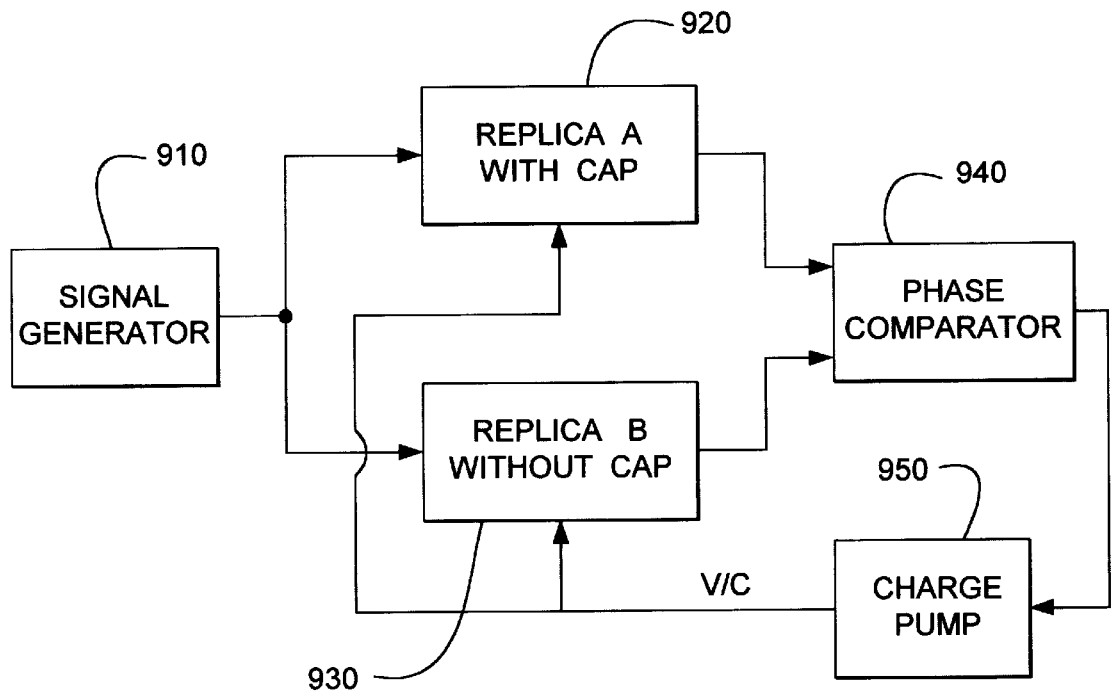
FIG. 9 illustrates a block schematic diagram of a phase locking loop, representing an embodiment of the invention.

The basic block diagram of the phase matching loop circuit is shown in FIG. 9. A signal generator 910 is coupled to both a first replica 920 and a second replica 930. The first replica 920 includes capacitors. The second replica 930 does not include capacitors. The first replica 920 and the second replica 930 are coupled to a phase comparator 940. The phase comparator is coupled to a charge pump 950. The charge pump 950 is coupled to both the first replica 920 and the second replica 930, thereby completing the phase matching loop. The charge pump 950 generates an output $v_R$.

Still referring to FIG. 9 the resistor R in the first replica 920, and a similar resistor in the second replica 930 are implemented with an NMOS transistor (or a PMOS transistor). The output of the change pump 950, $v_R$, is used to control the gate voltage of this NMOS transistor. At steady state, the equivalent resistance R, and the capacitance C, plus any parasitic capacitances at nodes A and B, will provide the required phase relationship between the outputs from the two replicas with regard to the given cable characteristics (category) and the given cable length. This phase locking loop will constantly adjust $v_R$ to compensate for variations in the NMOS transistor due to process, temperature and voltage.

Figure 10:
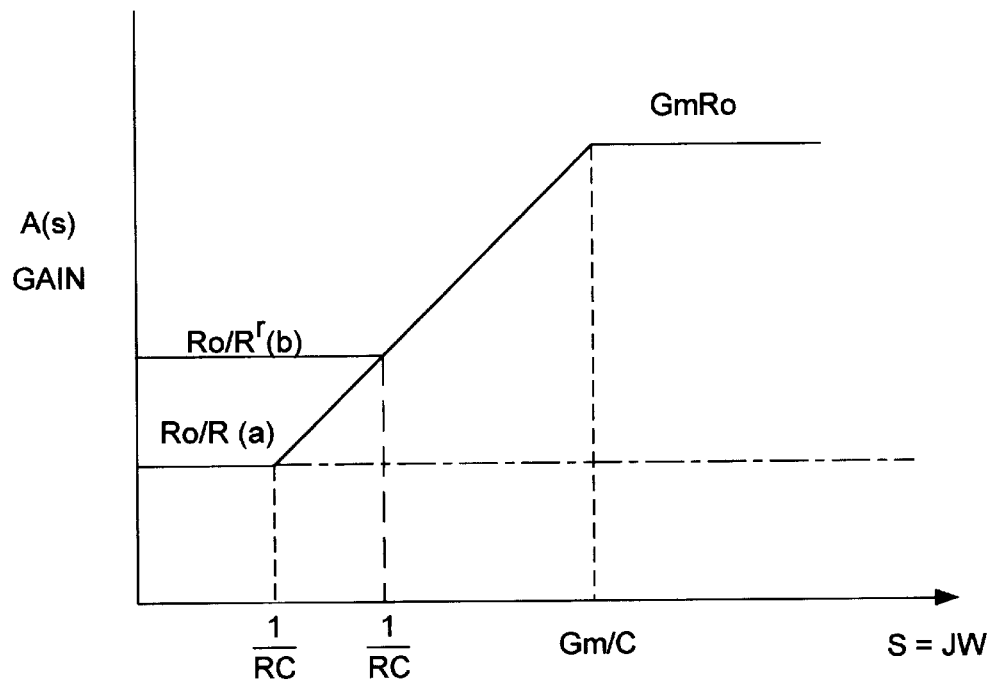
FIG. 10 illustrates a change in gain as a function of frequency due to an adjustment in $\upsilon_N$, representing an embodiment of the invention.
Figure 11:
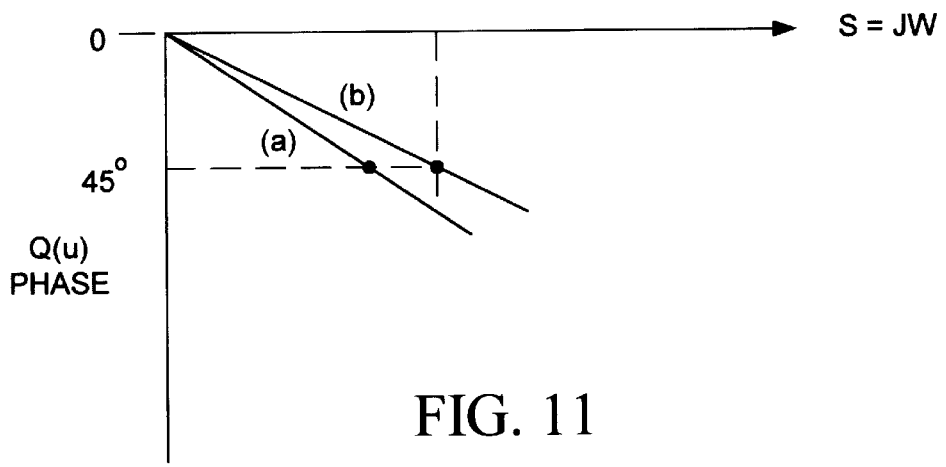
FIG. 11 illustrates a change in excessive phase as a function of frequency due to an adjustment to $\upsilon_N$, representing an embodiment of the invention.

The effect of the adjustment in $v_R$ on the transfer function is shown in FIG. 10. Referring to FIGS. 10 and 11, $$|A(\omega)| = g_m R_o \frac{\sqrt{\omega^2 + \frac{1}{R^2 C^2}}}{\sqrt{\omega^2 + \left(\frac{g_m}{C}\right)^2}}$$

$$\theta = \left[\tan^{-1}(\omega Rc) - \tan^{-1}\left(\frac{\omega C}{g_m}\right)\right]$$

Referring to FIG. 10, where R'<R, curve (a) is for R, and curve (b) is for R'. Therefore, the value of R will not only affect the low frequency gain but also change the phase response of the transfer function. With the feedback loop, one can look into the required R value for a given capacitance C to have a phase change of 45 degrees. Even if the total capacitance value varies with process (typically~10%) the resistance R will be adjusted accordingly.

Second Aspect

Figure 12:
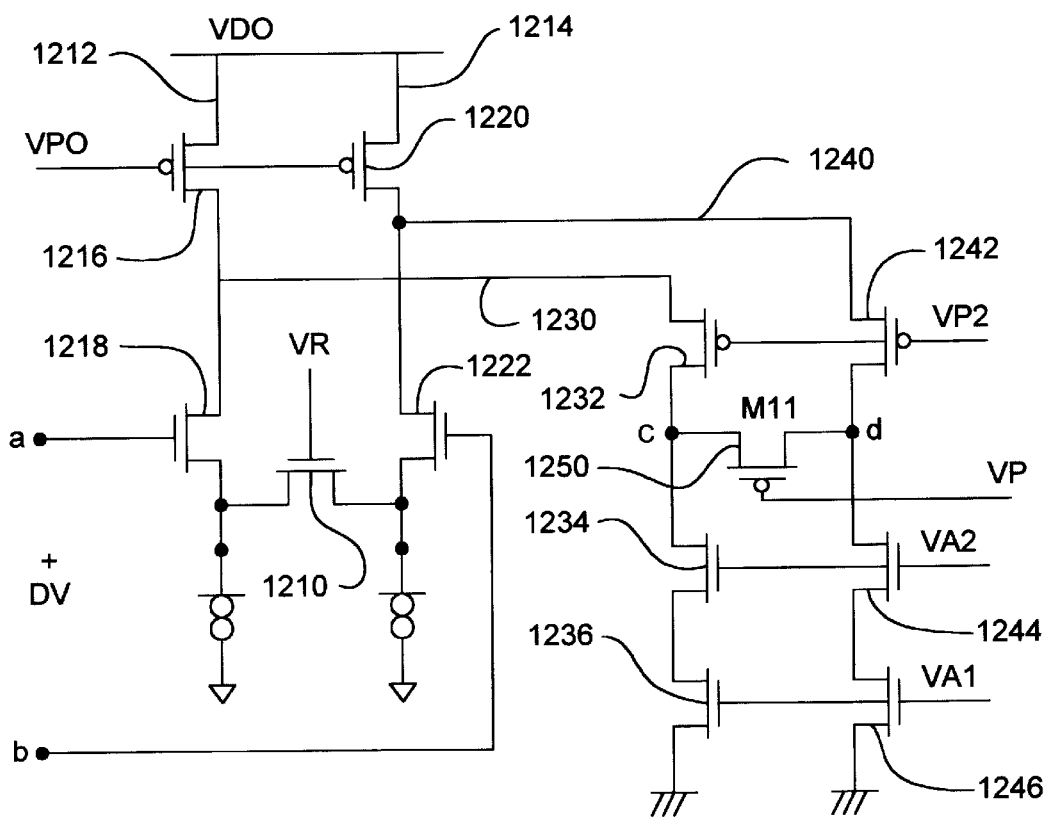
FIG. 12 illustrates an electrical schematic diagram of an amplitude locking loop, representing an embodiment of the invention.

However, as R changes, so does the low frequency gain, $R_0$/R. Another feedback loop can be provided to cancel out the variations in R. This can be accomplished by changing $R_0$ into a transistor. An example of a circuit to cancel out variations in R is illustrated in FIG. 12. It should be noted that the common mode feedback circuit is not shown in FIG. 12.

Referring to FIG. 12, a first transistor 1210 is located between a first branch 1212 and a second branch 1214. The first branch 1212 includes a second transistor 1216 in series with Referring to FIG. 12, a first transistor 1210 is located between a first branch 1212 and a second branch 1214. The first branch 1212 includes a second transistor 1216 in series with a third transistor 1218. The second branch 1214 includes a fourth transistor 1220 in series with a fifth transistor 1222. The folded cascode topology is implemented with a third branch 1230 and a fourth branch 1240. The third branch 1230 includes a sixth transistor 1232, a seventh transistor 1234, and an eighth transistor 1236. The fourth branch 1240 includes a ninth transistor 1242, a tenth transistor 1244, and an eleventh transistor 1246. A twelfth transistor 1250 verges the third branch 1230 and the fourth branch 1240. Between nodes C and D. The twelfth transistor 1250 defines a resistance $M_{11}$.

If output is too small, decrease $\upsilon_P$ to increase resistance $M_{11}$ where $\upsilon_{p1}, \upsilon_{p2}, \upsilon_{n1}$ and $\upsilon_{n2}$ are the fixed biased voltages for the current sources. $\upsilon_N$ is the controlled voltage from the previous phase locking circuit. $\upsilon_P$ is the control voltage from this DC gain loop. Since we are only interested in the low frequency gain, a fixed voltage $\Delta\upsilon$, such as, for example, 0.5 volts, can be applied to a and b. The differential amplifier will then vary $\upsilon_P$ so that the voltage across d and c will be exactly equal to $\Delta\upsilon$ if the low frequency gain of 1 is desired.

The equalizer can be implemented with the folded cascode topology shown in FIG. 12 by adding a capacitor in parallel with the first transistor 1210 controlled by $v_N$. The amplitude locking loop shown in FIG. 12 does not need a capacitor in parallel with the transistor controlled by $V_N$.

Figure 13:
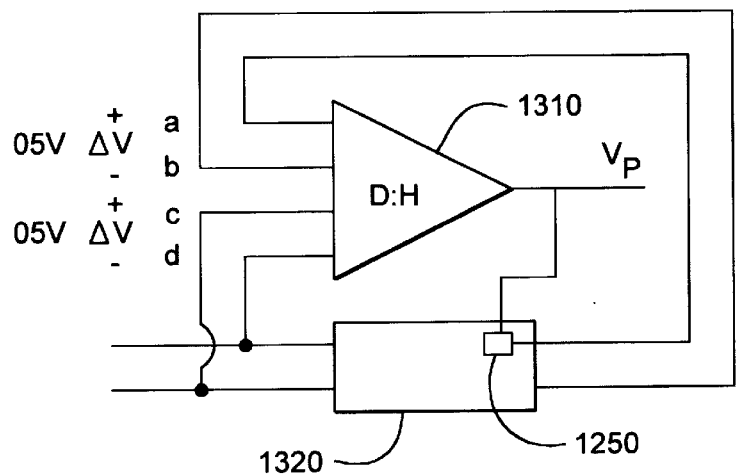
FIG. 13 illustrates an electrical schematic diagram of an amplitude locking loop, representing an embodiment of the invention.

FIG. 13 shows a higher-level schematic of the amplitude locking loop. A differential amplifier 1310 generates the control voltage $V_P$. The differential amplifier 1310 is coupled to a circuit 1320 (which can be equivalent to the circuit shown in FIG. 12) that includes the twelfth transistor 1250 which functions as a resistor. The differential amplifier 1310 thus adjusts the resistance of the twelfth transistor 1250 so as to optimize the difference between the differential voltage AB and the differential voltage CD. In preferred embodiments, optimizing this difference means minimizing the difference since the applied differential voltage CD is for a given frequency corresponding to the corner frequency or break point of the high pass response. At this point, the gain is substantially equal to 1. The corner frequency or break point of the high pass response can be termed a zero point.

Third Aspect

Figure 14:
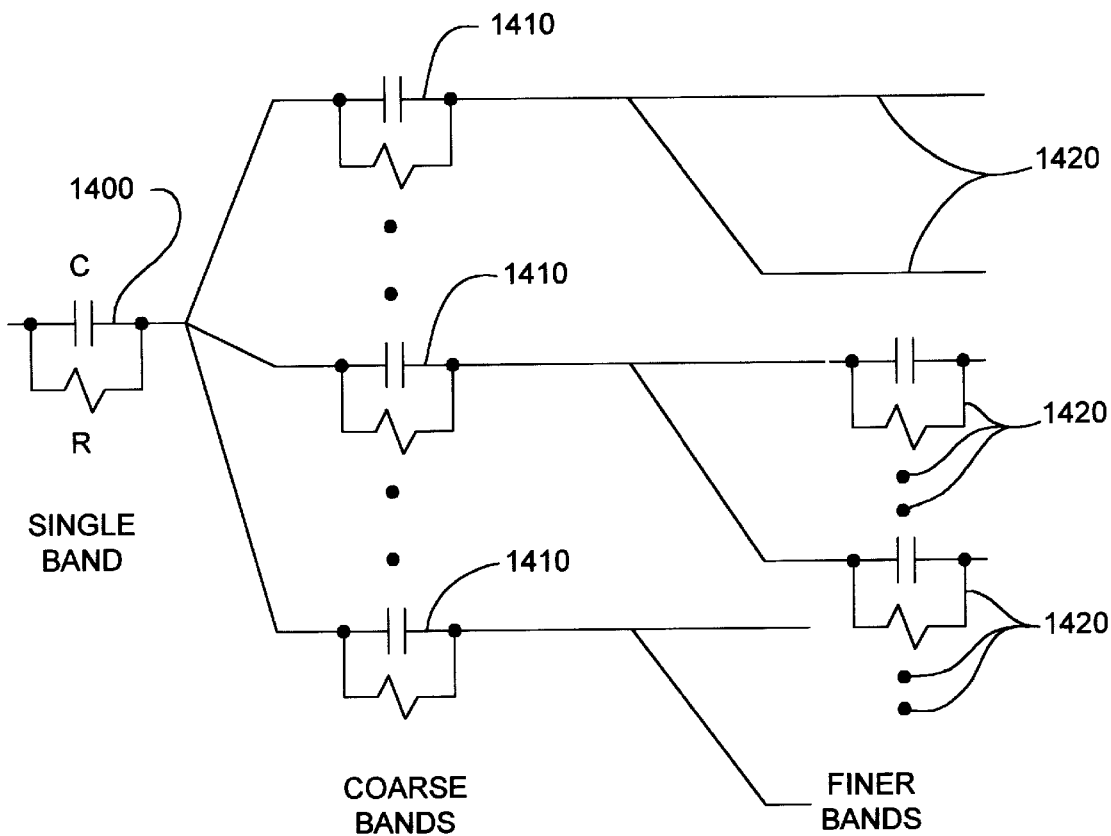
FIG. 14 illustrates an electrical schematic diagram of a coarse-fine multiple-band equalizer, representing an embodiment of the invention.

Referring to FIG. 14, a multiple band structure can be employed to cover different cable lengths with a single equalizer. A single band 1400 is divided into a plurality of coarse band segments 1410. The invention can subdivide each of the plurality of coarse band segments 1410 to provide finer tuning of the performance of the equalizer. The plurality of coarse band segments 1410 is subdivided into a plurality of fine band segments 1420. It can be appreciated that FIG. 14 depicts a multiple-band approach that can be implemented by selecting a coarse band and then a fine band within that coarse band, or by stepping through all fine bands within a coarse band before selecting another coarse band.

Still referring to FIG. 14, this coarse-fine multiple-band approach provides near continuous adjustable characteristics with simple control logic. The main equalizer segments will be turned on initially. The supporting circuitry will then determine how many of the finer segments need to be added on to optimize the performance of the Equalizer for the given cable length and signal amplitudes.

Combination of Three Aspects

Figure 15:
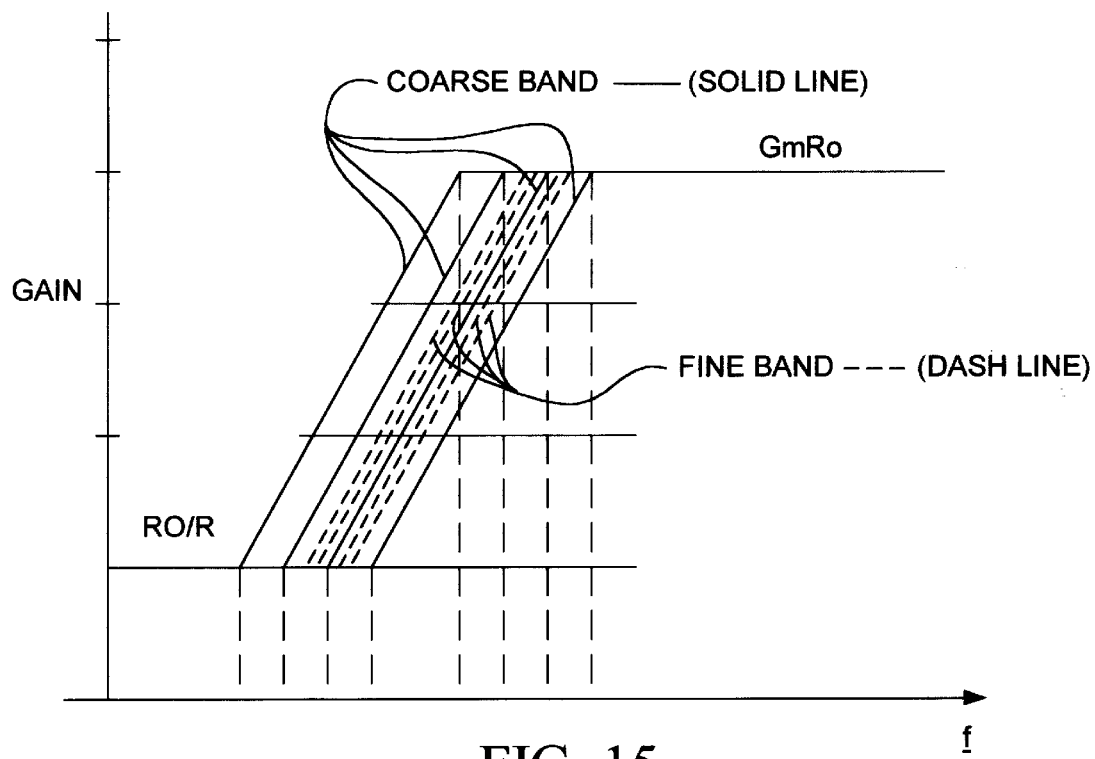
FIG. 15 illustrates gain as a function of frequency for a number of coarse bands, one of the coarse bands being subdivided into a number of finer bands, representing an embodiment of the invention.

A combination of the multiple-band approach and the multiple-feedback circuits gives an unexpectedly advantageous equalizer transfer function which is the inverse of the cable characteristics. The combination equalizer transfer function is shown in FIG. 15. Four coarse bands with solid lines are depicted. One of the coarse bands is subdivided into fine bands depicted with dashed lines. The multiple-band approach permits fine tuning for different cable lengths.

Figure 16:
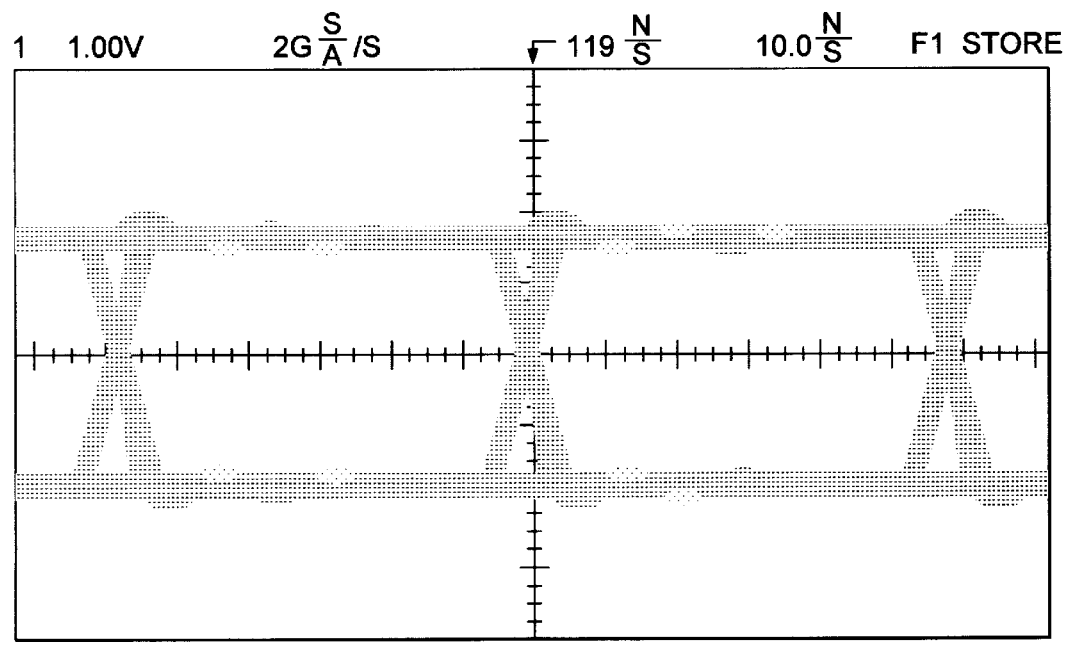
FIG. 16 represents a time domain representation of a high frequency signal and a low frequency signal recovered after passing through a 110 meter CAT5 cable, representing an embodiment of the invention.

FIG. 16 depicts recovered 5B data from a 110 meter length CAT5 cable. It can be seen from FIG. 16 that the effect of the adaptive equalizer is to separate the high frequency signal from the low frequency signal.

EXAMPLES

Specific embodiments of the invention will now be further described by the following, nonlimiting examples which will serve to illustrate in some detail various features of significance. The examples are intended merely to facilitate an understanding of ways in which the invention may be practiced and to further enable those of skill in the art to practice the invention. Accordingly, the examples should not be construed as limiting the scope of the invention.

Example 1

Figure 17:
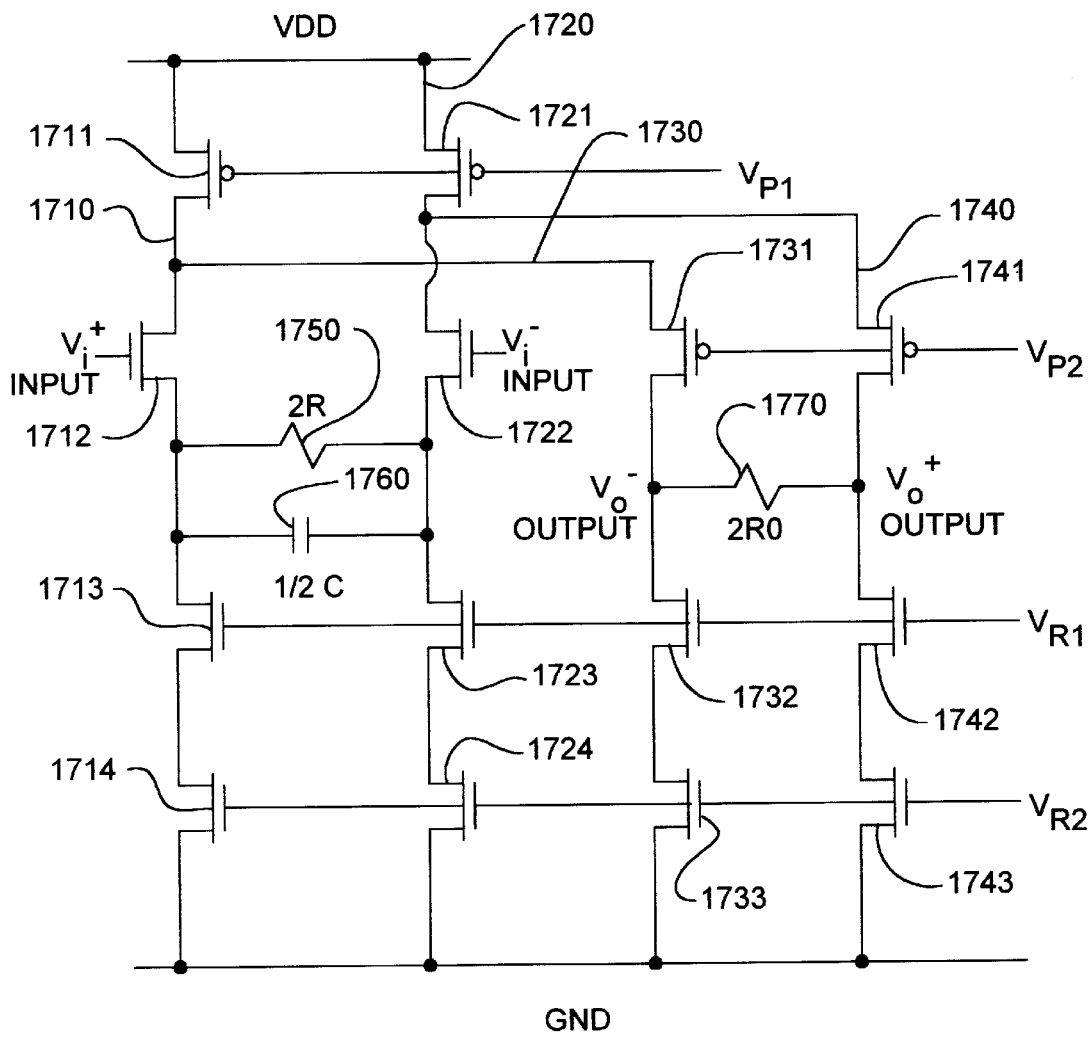
FIG. 17 illustrates an electrical schematic diagram of an integrated equalizer, representing an embodiment of the invention.

An integrated equalizer for signal frequencies up to 25 MHz can be implemented with CMOS technology as shown in FIG. 17 where $\upsilon_{p1}, \upsilon_{p2}, \upsilon_{n1}$ and $\upsilon_{n2}$ are the bias voltages. The common mode feedback circuit is not shown in FIG. 17. The integrated equalizer includes a first branch 1710, a second branch 1720, a third branch 1730, and a fourth branch 1740. The first branch 1710 includes a first transistor 1711, a second transistor 1712, a third transistor 1713, and a fourth transistor 1714. The second branch 1720 includes a fifth transistor 1721, a sixth transistor 1722, a seventh transistor 1723, and an eighth transistor 1724. The third branch 1730 is connected to the first branch 1710 between the first transistor 1711 and the second transistor 1712. The third branch 1730 includes a ninth transistor 1731, a tenth transistor 1732, and an eleventh transistor 1733. The fourth branch 1740 is connected to the second branch 1720 between the fifth transistor 1721 and the sixth transistor 1722. The fourth branch 1740 includes a twelfth transistor 1741, a thirteenth transistor 1742, and a fourteenth transistor 1743. A first resistor 1750 bridges the first branch 1710 and the second branch 1720. A capacitor 1760 bridges the first branch 1710 and the second branch 1720. The first resistor 1750 and the capacitor 1760 are in parallel. Both the first resistor 1750 and the capacitor 1760 are coupled to the first branch 1710 between the second transistor 1712 and the third transistor 1713. Similarly, both the first resistor 1750 and the capacitor 1760 are coupled to the second branch 1720 between the sixth capacitor 1722 and the seventh capacitor 1723. A second resistor 1770 is coupled to the third branch 1730 between the ninth transistor 1731 and the tenth transistor 1732. The second resistor 1770 is coupled to the fourth branch 1740 between the twelfth transistor 1741 and the thirteenth transistor 1742.

For example, for 100BT the signal of interest locates at or below 62.5 MHz. To avoid or minimize the additional phase shift or amplitude loss due to the unwanted pole, $$\frac{g_m}{C}$$

must be at least 40 times higher. This gives $$\frac{g_m}{C} > 40 \times 62.5 \text{ MHz} = 2.5 \text{ GHz}$$

For C≈2 pf, $g_m \geq 31.4$ mS. At 1 mA bias current, a typical 0.5 μm CMOS technology will require the size of the input transistor to be larger than approximately 2000 μm with a channel length of approximately 05 μm.

Example 2

The large input transistors needed in the previous example may will increase the input capacitance which may introduce another unwanted pole, right at the input. To overcome this issue, the invention can use a modified equalizer which can cancel out, in first order, the pole in the circuit and avoid using large transistors at the input.

In order to eliminate the unwanted pole in this critical circuit, a local feedback circuit is added to reduce the effect of the transconductance of the input transistors on the pole. As a result, the effective transfer function will have single zero only.

Figure 18:
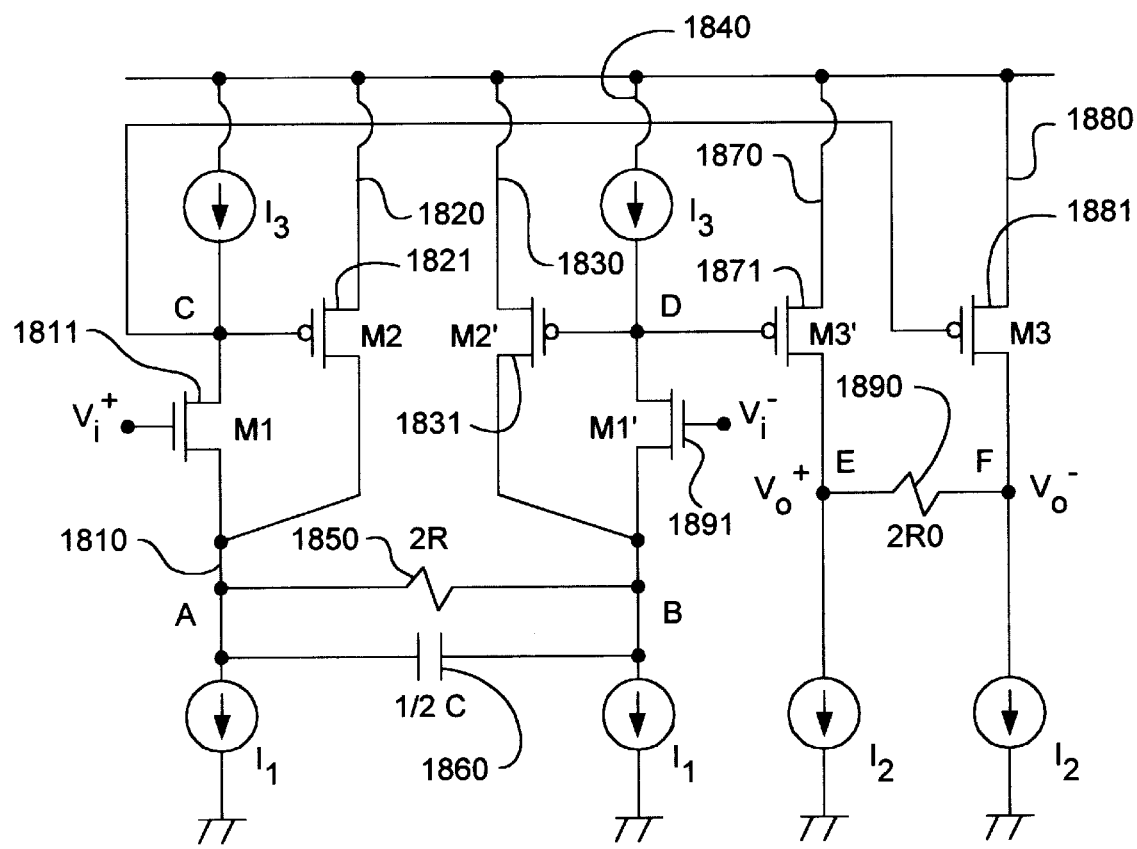
FIG. 18 illustrates an electrical schematic diagram of an integrated equalizer, representing an embodiment of the invention.

The modified circuit schematic is shown in FIG. 18. Again, the common mode feedback circuit is not shown in FIG. 18.

Referring to FIG. 18, a first branch 1810 includes a first transistor 1811 defining a resistance M1. The first branch 1810 is coupled to a second branch 1820 that includes a second transistor 1821 defining a resistance M2. A third branch 1830 includes a third transistor 1831 defining a resistance M2'. The third branch 1830 is coupled to a fourth branch 1840 that includes a fourth transistor 1841 defining a resistance M1'. A first resistor 1850 and a capacitor 1860 are connected in parallel between the first branch 1810 and the fourth branch 1840. A fifth branch 1870 includes a fifth transistor 1871 defining a resistance M3'. A sixth branch 1880 includes a sixth transistor 1881 defining a resistance M3. A second transistor 1890 is coupled between the fifth branch 1870 and the sixth branch 1880 at nodes E and F, respectively.

Figure 19:
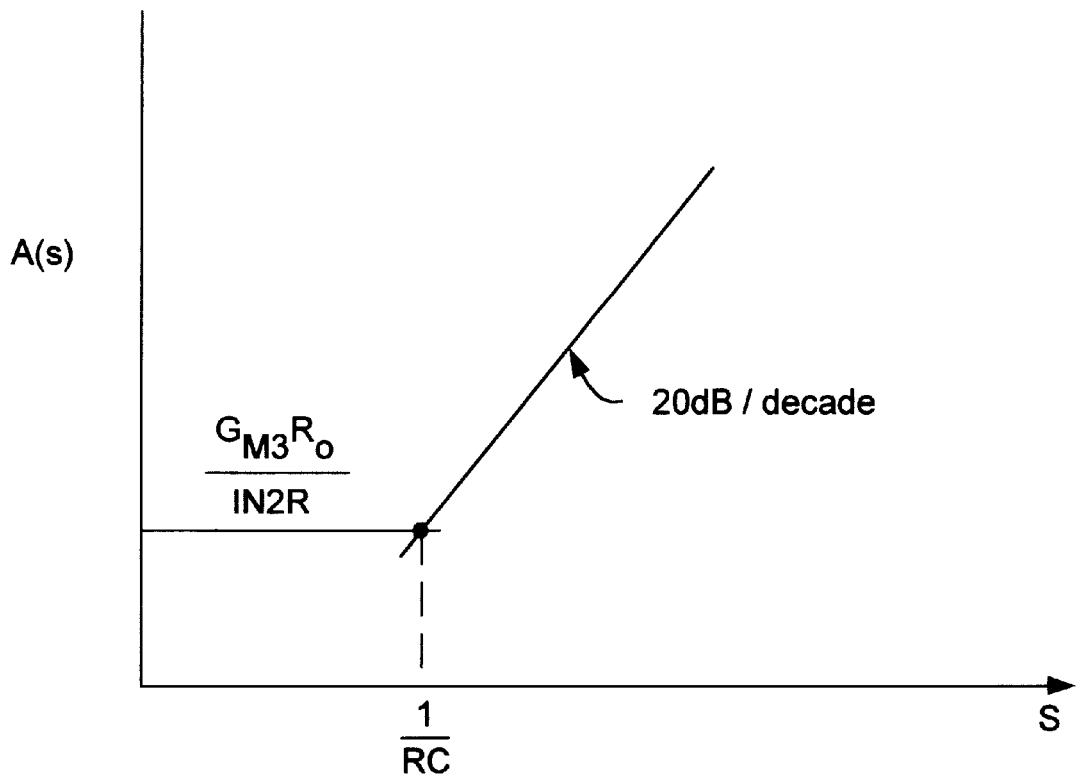
FIG. 19 illustrates gain as a function of frequency for an adaptive equalizer, representing an embodiment of the invention.

It can be shown that the transfer function of the modified equalizer cell becomes $$A(s) = \frac{g_{m3}R_o}{g_{m2}R}(1 + SRC)$$

assuming that $gm_2 >> g_0$, where $gm_2$ is the transconductance of a PMOS defining $M_2$, $g_0$ is the output conductance at node C, and $gm_3$ is the transconductance of a PMOS defining $M_3$. With the design shown in FIG. 18, the dc (or low frequency) gain is determined by the ratio of two transconductances and two resistances. This obviates transconductance problems. The possible unwanted pole comes from nodes C, D, and output nodes E, F. Since the parasitic capacitances at these nodes are relatively small compared with the capacitance C, the additional poles at these nodes can be pushed into higher frequency. Another advantage of the design shown in FIG. 18 is that the transconductance $gm_1$ of a NMOS defining $M_1$ does not affect the transfer function. This gives this design shown in FIG. 18 an additional freedom. The final transfer function is plotted in FIG. 19.

Practical Applications of the Invention

A practical application of the invention that has value within the technological arts is coupling the nodes of a local area network, or even a metropolitan or wide area network. Further, the invention is useful in conjunction with monitoring an array of sensors (such as are used for the purpose of an alarm system), or in conjunction with repeaters (such as are used for the purpose of relaying signals), or the like. There are virtually innumerable uses for the invention, all of which need not be detailed here.

Advantages of the Invention

An adaptive equalizer, representing an embodiment of the invention, can be cost effective and advantageous for at least the following reasons. The invention allows a number of different cable lengths to be supported by a single equalizer. The invention obviates the problems caused by variations in the values of $R_0$ and R due to variations in materials and/or processing and/or operational temperature. The invention obviates the difficulties in locating the zero (1\RC) due to variations in materials and/or processing and/or temperature of operation. The invention provides a suitable gain at much higher frequencies than traditional equalizers.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be assembled in the disclosed configuration, but could be assembled in virtually any configuration. Further, the individual components need not be fabricated from the disclosed subcomponents, but could be fabricated from virtually any suitable subcomponents. Further, although the adaptive equalizer described herein is a physically separate module, it will be manifest that the adaptive equalizer may be integrated into the apparatus with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A method of transforming an equalizer input signal at a receiver to approximate an output signal at a transmitter, comprising:

providing said receiver with an equalizer and a phase matching loop;

applying a reference input signal at a first given frequency and a given amplitude to said phase matching loop so as to emulate a phase shifted input signal for said first given frequency and a given category of cable having a given length;

varying a resistance within said phase matching loop so that said phase matching loop will transform a reference input phase of said reference input signal to a reference output phase that is a function of said first given frequency, said given category of cable, and said given length; and employing said resistance in said equalizer to transform an input phase of said equalizer input signal so as to approximate an output phase of said output signal.

2. The method of claim 1, further comprising:

providing said receiver with an amplitude locking loop;

applying a reference fixed voltage to said amplitude locking loop so as to emulate an attenuated input signal at a second given frequency for said given category of cable and said given length;

varying a control voltage to adjust an output resistance within said amplitude locking loop to optimize a difference between said fixed voltage and an output voltage from said amplitude locking loop, said control voltage being varied from a control differential amplifier within said amplitude locking loop, said control differential amplifier being controlled by said difference; and employing said control voltage in said equalizer to transform an input amplitude of said equalizer input signal to approximate an output amplitude of said output signal.

3. The method of claim 2, wherein i) said second given frequency is a zero point frequency and ii) varying said control voltage to adjust an output resistance within said amplitude locking loop to optimize said difference includes minimizing said difference.

4. The method of claim 1, further comprising:

providing said equalizer with a plurality of coarse equalizer segments adapted to provide coarse adjustment;

comparing an equalizer output to a desired given output level from the equalizer; and if the equalizer output is greater than the desired given output level from the equalizer, reducing a number of coarse equalizer segments in said equalizer to decrease a capacitance, and if the equalizer output is lower than the desired given output level from the equalizer, increasing the number of coarse equalizer segments in said equalizer to increase said capacitance.

5. The method of claim 4, further comprising:

providing at least one of said coarse equalizer segments with a plurality of fine equalizer segments adapted to provide fine adjustment;

further comparing said equalizer output to said given output level from said equalizer; and if the equalizer output is greater than said given output level from said equalizer, reducing a number of fine equalizer segments in said equalizer to decrease said capacitance, and if the equalizer output is less than said given output level from said equalizer, increasing said number of fine equalizer segments in said equalizer to increase said capacitance.

6. The method of claim 1, wherein said given length is variable.

7. The method of claim 6, wherein said given length is selected from a plurality of alternatives.

8. The method of claim 6, wherein said given length is determined by a cable length measurement.

9. The method of claim 1, wherein said given category of cable is variable.

10. The method of claim 9, wherein said given category of cable is selected from a plurality of alternatives.

11. The method of claim 9, wherein said given length is determined by a cable length measurement.

12. A method of transforming an equalizer input signal at a receiver to approximate an output signal at a transmitter, comprising:

providing said receiver with an equalizer and an amplitude locking loop applying a reference fixed voltage to said amplitude locking loop so as to emulate an attenuated input signal at a given frequency for a given category of cable and a given length;

varying a control voltage to adjust an output resistance within said amplitude locking loop to optimize a difference between said fixed voltage and an output voltage from said amplitude locking loop, said control voltage being varied from a control differential amplifier within said amplitude locking loop, said control differential amplifier being controlled by said difference; and employing said control voltage in said equalizer to transform an input amplitude of said equalizer input signal to approximate an output amplitude of said output signal.

13. The method of claim 12, wherein i) said given frequency is a zero point frequency and ii) varying said control voltage to adjust an output resistance within said amplitude locking loop to optimize said difference includes minimizing said difference.

14. The method of claim 12, further comprising:

providing said equalizer with a plurality of coarse equalizer segments adapted to provide coarse adjustment;

comparing an equalizer output to a desired given output level from the equalizer; and if the equalizer output is greater than the desired given output level from the equalizer, reducing a number of coarse equalizer segments in said equalizer to decrease a capacitance, and if the equalizer output is lower than the desired given output level from the equalizer, increasing the number of coarse equalizer segments in said equalizer to increase said capacitance.

15. The method of claim 14, further comprising:

providing at least one of said coarse equalizer segments with a plurality of fine equalizer segments adapted to provide fine adjustment;

further comparing said equalizer output to said given output level from said equalizer; and if the equalizer output is greater than said given output level from said equalizer, reducing a number of fine equalizer segments in said equalizer to decrease said capacitance, and if the equalizer output is less than said given output level from said equalizer, increasing said number of fine equalizer segments in said equalizer to increase said capacitance.

16. The method of claim 12, wherein said given length is variable.

17. The method of claim 16, wherein said given length is selected from a plurality of alternatives.

18. The method of claim 16, wherein said given length is determined by a cable length measurement.

19. The method of claim 12, wherein said given category of cable is variable.

20. The method of claim 19, wherein said given category of cable is selected from a plurality of alternatives.

21. The method of claim 19, wherein said given length is determined by a cable length measurement.

22. A method of transforming an equalizer input signal at a receiver to approximate an output signal at a transmitter, comprising:

providing said receiver with an equalizer having with a plurality of coarse equalizer segments adapted to provide coarse adjustment;

comparing an equalizer output to a desired given output level from the equalizer;
  if the equalizer output is greater than the desired given output level from the equalizer, reducing a number of coarse equalizer segments in said equalizer to decrease a capacitance, and
  if the equalizer output is lower than the desired given output level from the equalizer, increasing the number of coarse equalizer segments in said equalizer to increase said capacitance;
providing at least one of said plurality of coarse equalizer segments with a plurality of fine equalizer segments adapted to provide fine adjustment;
further comparing said equalizer output to said given output level from said equalizer; and
  if the equalizer output is greater than said given output level from said equalizer, reducing a number of fine equalizer segments in said equalizer to decrease said capacitance, and
  if the equalizer output is less than said given output level from said equalizer, increasing said number of fine equalizer segments in said equalizer to increase said capacitance.

23. The method of claim 22, further comprising providing said receiver with a phase matching loop coupled to said equalizer;
applying a reference input signal at a first given frequency and a given amplitude to said phase matching loop so as to emulate a phase shifted input signal for said first given frequency and a given category of cable having a given length;
varying a resistance within said phase matching loop so that said phase matching loop will transform a reference input phase of said reference input signal to a reference output phase that is a function of said first given frequency, said given category of cable, and said given length; and
employing said resistance in said equalizer to transform an input phase of said equalizer input signal so as to approximate an output phase of said output signal.

24. The method of claim 23, wherein said given length is variable.

25. The method of claim 24, wherein said given length is selected from a plurality of alternatives.

26. The method of claim 24, wherein said given length is determined by a cable length measurement.

27. The method of claim 23, wherein said given category of cable is variable.

28. The method of claim 27, wherein said given category of cable is selected from a plurality of alternatives.

29. The method of claim 27, wherein said given length is determined by a cable length measurement.

* * * * *